US011229116B2

(12) United States Patent (10) Patent No.: US 11,229,116 B2
Shibata et al. (45) Date of Patent: Jan. 18, 2022

(54) BOARD ASSEMBLY SHEET

(71) Applicant: NITTO DENKO CORPORATION, Osaka (JP)

(72) Inventors: Shusaku Shibata, Osaka (JP); Hiromoto Haruta, Osaka (JP); Shuichi Wakaki, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 16/755,736

(22) PCT Filed: Oct. 2, 2018

(86) PCT No.: PCT/JP2018/036795
§ 371 (c)(1),
(2) Date: Apr. 13, 2020

(87) PCT Pub. No.: WO2019/082611
PCT Pub. Date: May 2, 2019

(65) Prior Publication Data
US 2020/0329560 A1 Oct. 15, 2020

(30) Foreign Application Priority Data
Oct. 26, 2017 (JP) .............................. JP2017-207356

(51) Int. Cl.
*H05K 1/11* (2006.01)
*H05K 3/00* (2006.01)
*H05K 1/18* (2006.01)

(52) U.S. Cl.
CPC ............. *H05K 1/115* (2013.01); *H05K 1/118* (2013.01); *H05K 1/189* (2013.01); *H05K 3/007* (2013.01);
(Continued)

(58) Field of Classification Search
CPC ........ H05K 1/115; H05K 1/189; H05K 1/118; H05K 3/007; H05K 3/0052;
(Continued)

(56) References Cited

U.S. PATENT DOCUMENTS 10,264,664 B1 *  4/2019  Vinciarelli  .............  H05K 3/207
2010/0155110 A1 *  6/2010  Watanabe  ..............  H05K 3/284
174/255

(Continued)

FOREIGN PATENT DOCUMENTS

JP   S57-157164 U    10/1982
JP   S57-157164 U1 *  1/1984
(Continued)

OTHER PUBLICATIONS

International Search Report Issued in PCT/JP2018/036795 dated Jan. 8, 2019.
(Continued)

*Primary Examiner* — William H. Mayo, III
*Assistant Examiner* — Rhadames Alonzo Miller
(74) *Attorney, Agent, or Firm* — Edwards Neils LLC; Jean C. Edwards, Esq.

(57) ABSTRACT

A board assembly sheet includes a plurality of mounting boards each for mounting an electronic component. The mounting boards are defined in the board assembly sheet. The mounting board has a total thickness of 60 μm or less. The board assembly sheet has a through hole passing through the board assembly sheet in a thickness direction. The through hole is formed to be along an end edge of the mounting board or along a phantom line extending along the end edge.

6 Claims, 10 Drawing Sheets

(52) U.S. Cl.
CPC ........... *H05K 3/0052* (2013.01); *H05K 1/117* (2013.01); *H05K 2201/0154* (2013.01); *H05K 2201/10121* (2013.01); *H05K 2201/10151* (2013.01); *H05K 2203/0152* (2013.01); *H05K 2203/0156* (2013.01); *H05K 2203/0759* (2013.01); *H05K 2203/1545* (2013.01)

(58) Field of Classification Search
CPC . H05K 2201/0154; H05K 2201/10151; H05K 2201/2203; H05K 2201/1545; H05K 2203/0152; H05K 1/117; H05K 2203/0759; H05K 2203/0156; H05K 2201/10121
See application file for complete search history.

(56) References Cited

U.S. PATENT DOCUMENTS

| | | | | |
|---|---|---|---|---|
| 2012/0103675 | A1* | 5/2012 | Kimura | H01P 1/20345 174/261 |
| 2014/0263585 | A1* | 9/2014 | Sweere | H01L 21/4846 228/180.22 |
| 2015/0107879 | A1* | 4/2015 | Hasegawa | H01L 23/13 174/255 |
| 2016/0165731 | A1* | 6/2016 | Hurwitz | H05K 1/09 361/761 |
| 2016/0286658 | A1* | 9/2016 | Matsubara | B32B 18/00 |
| 2016/0338204 | A1* | 11/2016 | McMullen | H05K 3/0097 |
| 2017/0135219 | A1* | 5/2017 | Hsu | H01L 23/49822 |
| 2018/0324953 | A1* | 11/2018 | Onitsuka | H03H 3/02 |
| 2019/0269016 | A1* | 8/2019 | Narag, II | H01L 33/62 |
| 2019/0357364 | A1* | 11/2019 | Lutschounig | H05K 1/0206 |
| 2020/0171606 | A1* | 6/2020 | Wu | H05K 3/0026 |
| 2020/0178402 | A1* | 6/2020 | Tsai | H05K 3/4691 |
| 2020/0288567 | A1* | 9/2020 | Orlowski | H05K 1/0266 |

FOREIGN PATENT DOCUMENTS

| | | |
|---|---|---|
| JP | 2005-210628 A | 8/2005 |
| JP | 2010-129638 A | 6/2010 |
| WO | 2007/099641 A1 | 9/2007 |
| WO | WO-2007099641 A1 * | 9/2007 ........... H05K 3/0052 |
| WO | 2017/078849 A | 5/2017 |

OTHER PUBLICATIONS

Written Opinion Issued in PCT/JP2018/036795 dated Jan. 8, 2019.
Office Action, which was issued by the Japanese Patent Office dated Oct. 26, 2021, in connection with Japanese Patent Application No. 2017-207356.

* cited by examiner

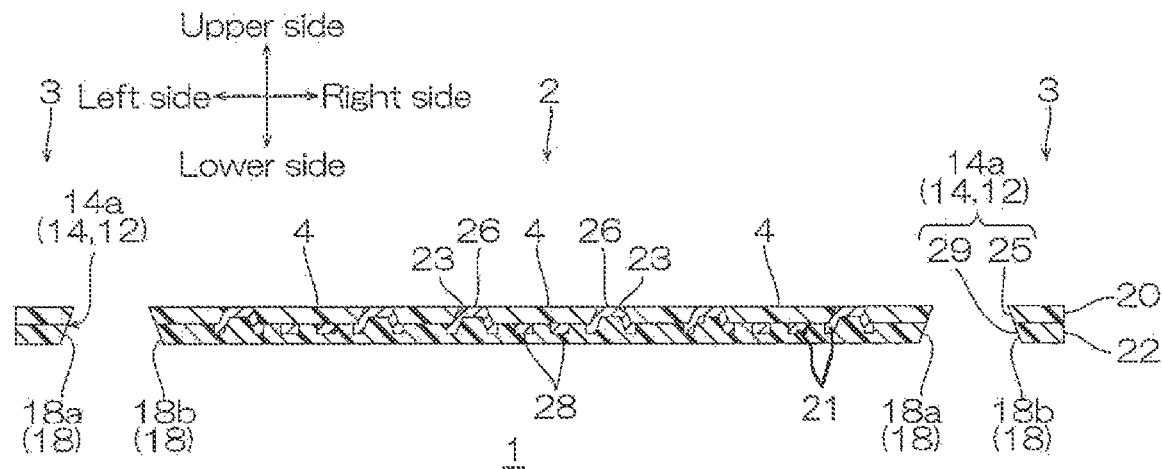
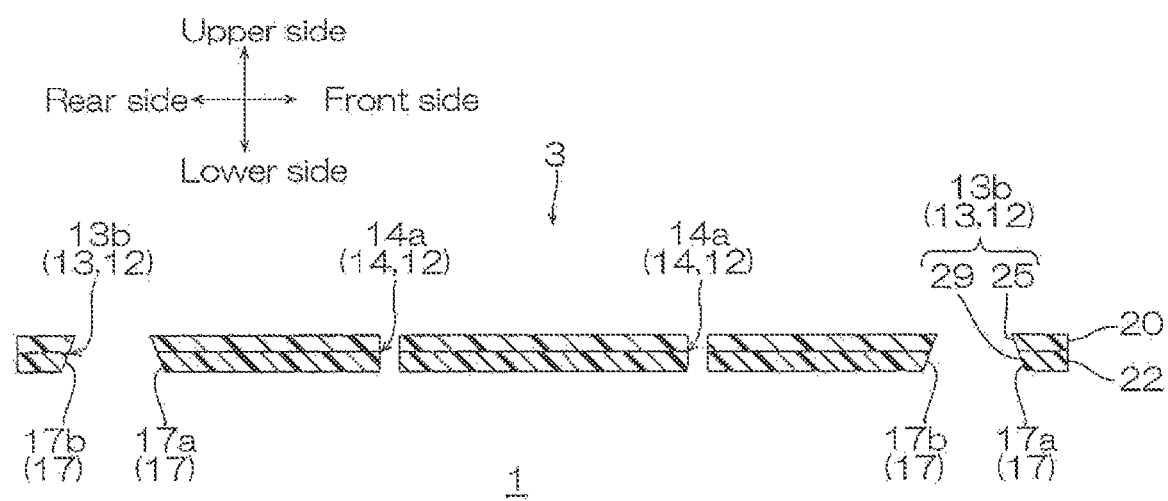

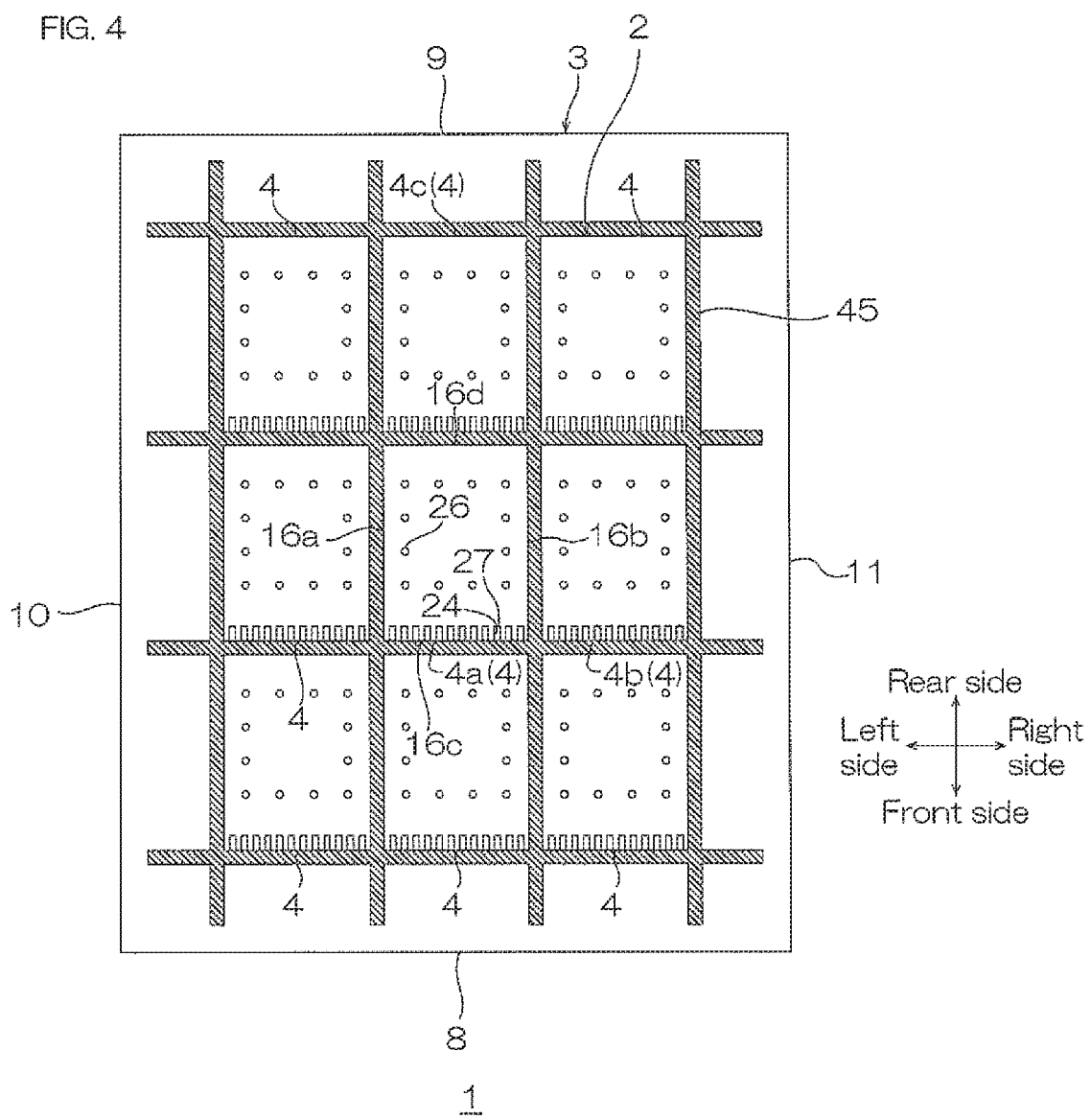

FIG. 10
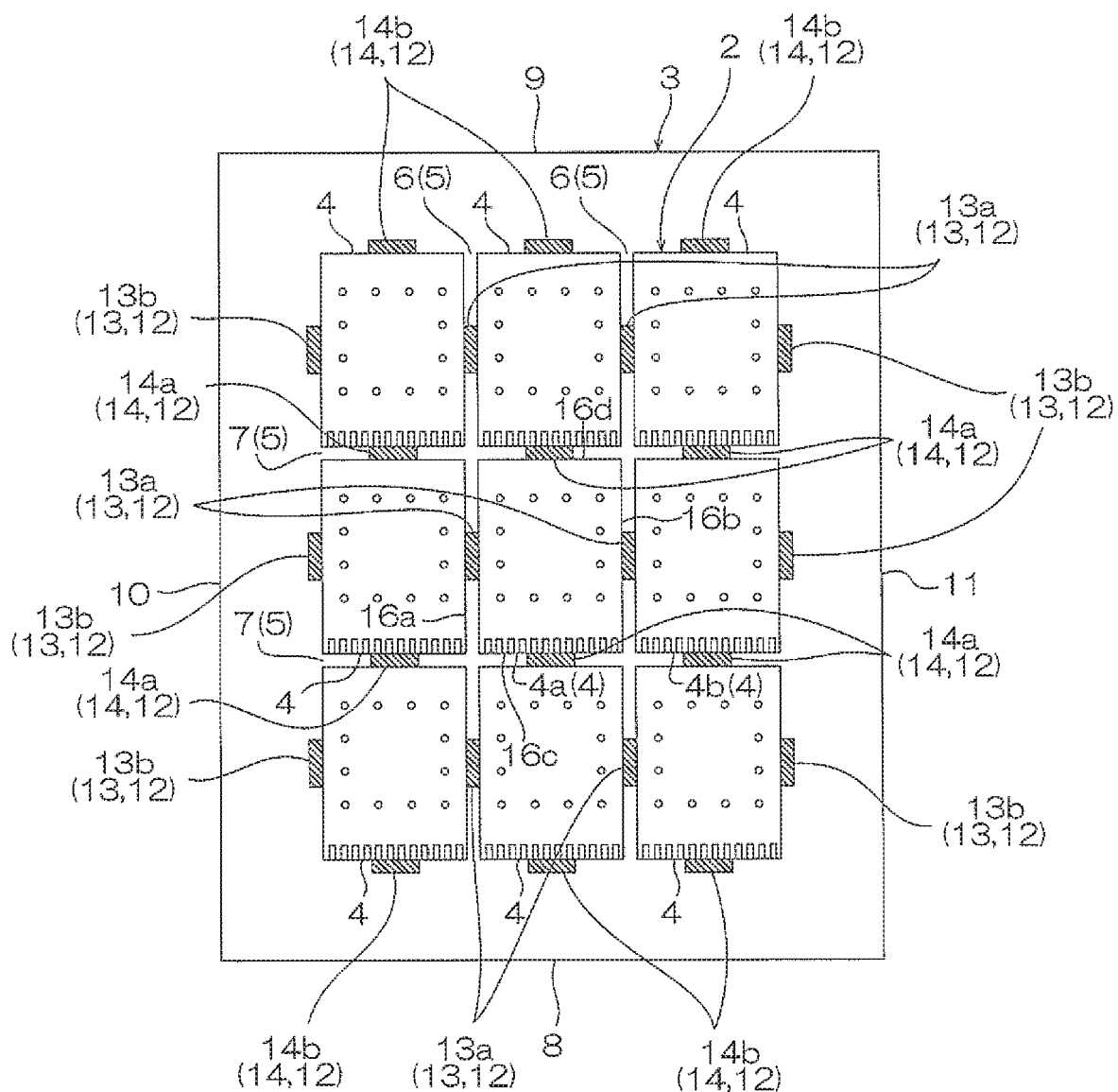
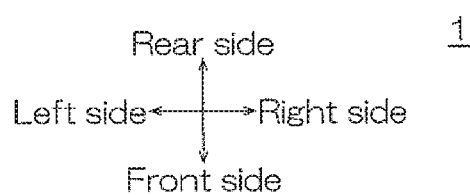

BOARD ASSEMBLY SHEET

CROSS-REFERENCE TO RELATED APPLICATIONS

The present application is a 35 U.S.C. 371 National Stage Entry of PCT/JP2018/036795, filed on Oct. 2, 2018, which claims priority from Japanese Patent Application No. 2017-207356, filed on Oct. 26, 2017, the contents of all of which are herein incorporated by reference in their entirety.

TECHNICAL FIELD

The present invention relates to a board assembly sheet.

BACKGROUND ART

Conventionally, an imaging device such as camera module mounted on a cellular phone or the like has been generally mounted with an optical lens, a housing that houses and retains the optical lens, an imaging element such as CMOS sensor and CCD sensor, and an imaging element-mounting board that is mounted with the imaging element for being electrically connected to an external wire. The imaging element is mounted on a generally central portion of the imaging element-mounting board, and the housing is disposed on a peripheral end portion of the imaging element-mounting board so as to surround the imaging element. Patent Document 1 discloses the board.

CITATION LIST

Patent Document

Patent Document 1: Japanese Unexamined Patent Publication No. 2005-210628

SUMMARY OF THE INVENTION

Problem to be Solved by the Invention

The imaging device used in the cellular phone or the like is required to further reduce its thickness (height) along with a demand for a smaller cellular phone. As one of the methods of reducing the height of the imaging device, a reduction in thickness of the imaging element-mounting board has been considered.

Generally, in the imaging element-mounting board, two types of a thick rigid-type wiring circuit board that reinforces the entire rear surface thereof with a metal plate, and a thin flexible-type wiring circuit board (FPC) that does not reinforce the entire rear surface thereof with the metal plate are used.

The FPC is not reinforced with the metal plate, so that a reduction in thickness thereof is possible compared to the rigid-type wiring circuit board. However, on the other hand, materials for the imaging element and the imaging element-mounting board are different from each other, so that when an imaging unit including the imaging element and the imaging element-mounting board is placed under the external environment where a high temperature and a low temperature are repeated, thermal distortion may be generated to cause warping of the imaging unit. As a result, there is a disadvantage that a deviation is generated in the position of the imaging element and the optical lens, so that an image is distorted.

Then, the use of an ITC having a significantly thin total thickness has been considered. Such an FPC has a significantly reduced thermal stress, so that generation of the warping can be suppressed.

However, the above-described FPC is thin and thus, easily broken. There is a disadvantage that, especially in view of mass production, the FPC board assembly sheet is broken when an FPC board assembly sheet having a plurality of FPCs is fabricated and next, the plurality of FPCs are singulated from the FPC assembly by a dicing blade. As a result, a yield is reduced.

The present invention provides a board assembly sheet that is capable of efficiently obtaining a plurality of mounting boards.

Means for Solving the Problem

The present invention [1] includes a board assembly sheet including a plurality of mounting boards each for mounting an electronic component, the mounting boards being defined in the board assembly sheet, wherein the mounting board has a total thickness of 60 µm or less, the board assembly sheet has a through hole passing through the board assembly sheet in a thickness direction, and the through hole is formed to be along an end edge of the mounting board or along a phantom line extending along the end edge.

According to the board assembly sheet, the through hole is formed to be along the end edge of the mounting board or along the phantom line. Thus, the dicing blade is inserted into the through hole, and the board assembly sheet can be cut from the side end edge thereof along the mounting board end edge or along the phantom line. Thus, when the dicing blade is brought into contact with the board assembly sheet, an impact or a distortion (deformation) imparted to the entire board assembly sheet can be reduced. Therefore, damage of the board assembly sheet and accordingly, the damage of the mounting board formed therein can be reduced at the time of singulation, and the yield of the mounting board can be improved. That is, the plurality of mounting boards can be efficiently obtained.

In addition, the through hole is formed in advance, so that cutting dusts generated by cutting can be reduced, and contamination of the mounting board can be suppressed.

The present invention [2] includes the board assembly sheet described in [1], wherein the mounting board has a generally rectangular shape when viewed from the top extending in a first direction and a second direction perpendicular to the first direction, and the through hole includes a first through hole extending in the first direction and a second through hole extending in the second direction.

According to the board assembly sheet, the first through hole extending in the first direction and the second through hole extending in the second direction are included, so that the impact or the distortion imparted to the entire board assembly sheet can be reduced at the time of cutting in the first direction and the second direction. Thus, the mounting board in a generally rectangular shape when viewed from the top can be more surely obtained without damage.

The present invention [3] includes the board assembly sheet described in [1] or [2], wherein a length of the through hole in an orthogonal direction perpendicular to a direction along the end edge is 2000 µm or less.

According to the board assembly sheet, when the board assembly sheet is cut by using a dicing blade having the same width as the length of the through hole in the orthogonal direction, the cutting area can be reduced. Thus, the cutting dusts can be reduced, and the contamination of the mounting board can be suppressed.

The present invention [4] includes the board assembly sheet described in [3], wherein the length of the through hole in the orthogonal direction is generally the same as a distance between two mounting boards next to each other in the orthogonal direction.

According to the board assembly sheet, the end edge of one mounting board and the end edge of the other mounting board can be cut by one cutting. Thus, there is no need for cutting in each of the end edges, so that the number of cutting steps can be reduced.

The present invention [5] includes the board assembly sheet described in any one of [1] to [4], wherein the through hole has end edges facing each other in a direction along the end edge gradually get closer to each other in the thickness direction.

According to the board assembly sheet, both end edges of the through hole have a shape of gradually getting closer to each other in the thickness direction, so that the dicing blade can be gradually brought into contact with the end edge of the through hole to be cut. Thus, the impact imparted to the entire board assembly sheet can be furthermore reduced, and the damage of the board assembly sheet can be furthermore suppressed.

The present invention [6] includes the board assembly sheet described in any one of [1] to [5], wherein the through hole is formed between two mounting boards next to each other.

According to the board assembly sheet, the through hole is formed in advance around the mounting board, so that adhesion of the cutting dusts to the mounting board can be furthermore suppressed at the time of cutting.

Effect of the Invention

The board assembly sheet of the present invention allow the plurality of mounting boards to be obtained efficiently, while suppressing the damage of the mounting board. In addition, the cutting dusts generated by the cutting can be reduced, and the contamination of the mounting board can be suppressed.

BRIEF DESCRIPTION OF THE DRAWINGS

FIGS. 2A to 2B show cross-sectional views of the board assembly sheet shown in FIG. 1:

FIG. 2A illustrating an A-A cross-sectional view and

FIG. 2B illustrating a B-B cross-sectional view.

FIG. 3A illustrating a metal supporting plate preparing step,

FIG. 3B illustrating a base insulating layer forming step,

FIG. 3C illustrating a conductive pattern forming step,

FIG. 3D illustrating a cover insulating layer forming step,

FIG. 3E illustrating a metal supporting plate removing step, and

FIG. 3F illustrating a cutting step.

FIG. 4 shows a plan view of a board assembly sheet after cutting.

FIG. 10 shows a plan view of a third embodiment of a board assembly sheet of the present invention.

DESCRIPTION OF EMBODIMENTS

Figure 1:
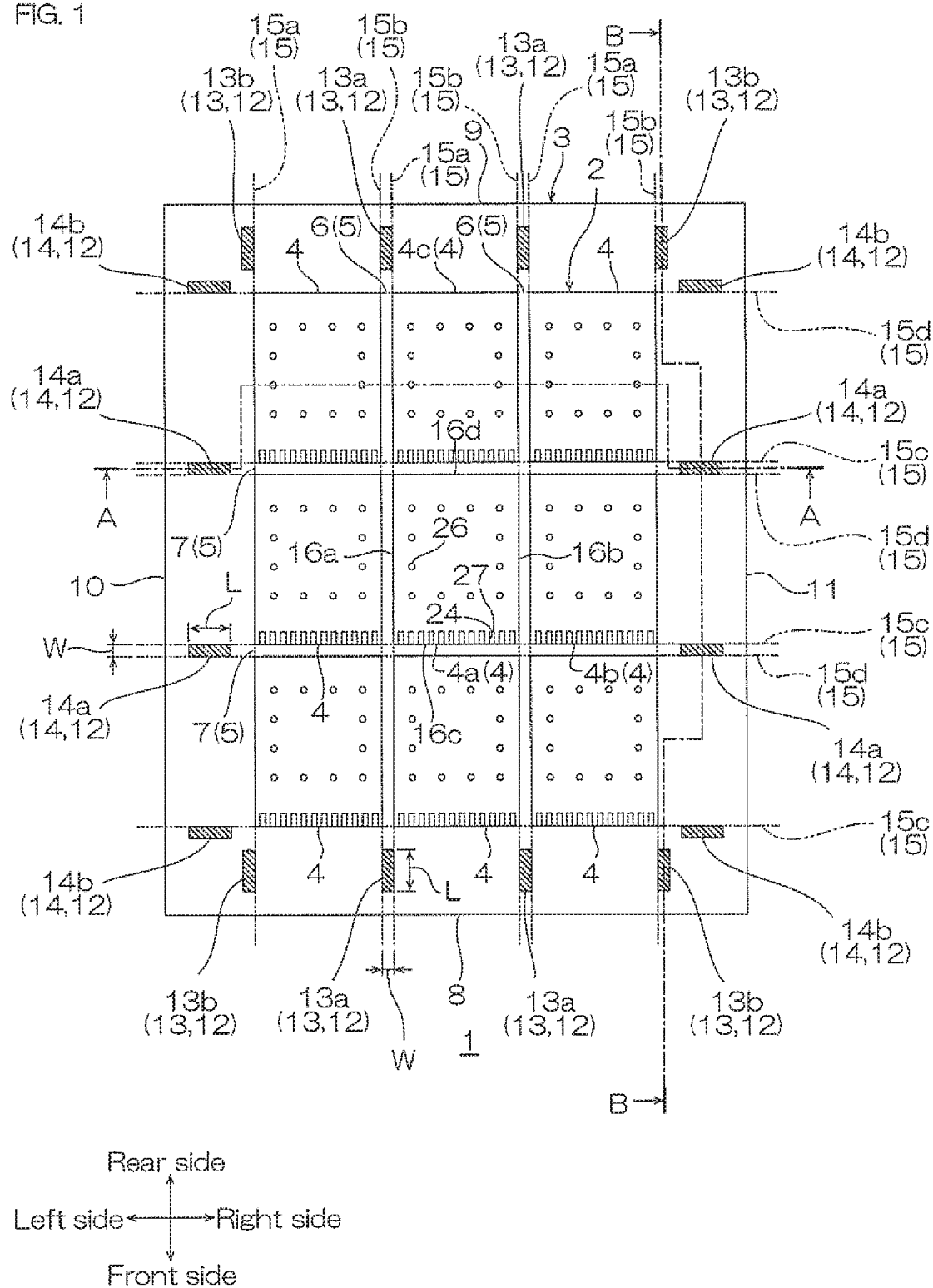
FIG. 1 shows a plan view of a first embodiment of a board assembly sheet of the present invention.

In FIG. 1, the up-down direction on the plane of the sheet is a front-rear direction (first direction), the lower side on the plane of the sheet is a front side (one side in the first direction), and the upper side on the plane of the sheet is a rear side (the other side in the first direction). The right-left direction on the plane of the sheet is a right-left direction (second direction perpendicular to the first direction), the left side on the plane of the sheet is a left side (one side in the second direction), and the right side on the plane of the sheet is a right side (the other side in the second direction). The paper thickness direction on the plane of the sheet is an up-down direction (thickness direction, a third direction perpendicular to the first direction and the second direction), the near side on the plane of the sheet is an upper side (one side in the thickness direction, one side in the third direction), and the far side on the plane of the sheet is a lower side (the other side in the thickness direction, the other side in the third direction). To be specific, directions are in conformity with direction arrows described in each view. When viewed from the top, a direction in which a through hole, a gap region, or the like extend long is referred to as a longitudinal direction, and a direction perpendicular to the longitudinal direction is referred to as a width direction. In FIGS. 1, 4, 6, 9, 10, and 11, the through hole in a board assembly sheet is shown with diagonal hatching.

First Embodiment

1. Board Assembly Sheet

A first embodiment of a board assembly sheet of the present invention is described with reference to FIG. 1.

A board assembly sheet 1 (hereinafter, also referred to as a board sheet 1) includes a plurality of mounting boards 4 to be described later, and as shown in FIG. 1, has a generally rectangular sheet shape (rectangle-shaped) extending in a plane direction when viewed from the top. The board sheet 1 is defined by a mounting board region 2 and a surrounding region 3.

The mounting board region 2 is positioned at generally the center of the board sheet 1 when viewed from the top, and is a region in which the plurality of (nine) mounting boards 4 are formed (defined). The mounting board region 2 has a generally rectangular shape when viewed from the top. In the mounting board region 2, the plurality of mounting boards 4 are disposed in alignment in a grid pattern at spaced intervals to each other in the front-rear direction and the right-left direction. That is, in the mounting board region 2, a gap region 5 in which the mounting board 4 is not formed is formed between the plurality of mounting boards 4 that are next to each other.

The mounting board 4 is a flexible wiring circuit board for mounting an electronic component, and has a generally rectangular shape (rectangle-shaped) when viewed from the top. As described later, the mounting board 4 includes a plurality of electronic component-connecting terminals 26, a plurality of external component-connecting terminals 27, and a plurality of wires 28.

The gap region 5 has a generally lattice shape when viewed from the top, and has a plurality of (two) first gap regions 6 extending in the front-rear direction (longitudinal direction), and a plurality of (two) second gap regions 7 extending in the right-left direction (longitudinal direction).

The plurality of first gap regions 6 are provided at spaced intervals to each other in the right-left direction. The first gap region 6 is formed linearly so as to be continuous from the front end edge (that is, a front end edge 16*c* of the mounting board 4 that is positioned at the frontmost side) to the rear end edge (that is, a rear end edge 16*d* of the mounting board 4 that is positioned at the rearmost side) of the mounting board region 2.

In the board sheet 1, one pair of through holes 12 (described later) are provided corresponding to each of the first gap regions 6. That is, the one pair of through holes 12 are disposed in the surrounding region 3 that is positioned at the outer side of each of the first gap regions 6. To be specific, one inner-side first through hole 13*a* is formed in a front-side region 8 that is positioned at the front side of the one first gap region 6, and the other inner-side first through hole 13*a* is formed in a rear-side region 9 that is positioned at the rear side of the first gap region 6.

The plurality of second gap regions 7 are provided at spaced intervals to each other in the front-rear direction. The second gap region 7 is formed linearly so as to be continuous from the left end edge (that is, a left end edge 16*a* of the mounting board 4 that is positioned at the leftmost side) to the right end edge (that is, a right end edge 16*b* of the mounting board 4 that is positioned at the rightmost side) of the mounting board region 2.

In the board sheet 1, the one pair of through holes 12 (described later) are provided corresponding to each of the second gap regions 7. That is, the one pair of through holes 12 are provided in the surrounding region 3 that is positioned at the outer side of each of the second gap regions 7. To be specific, one inner-side second through hole 14*a* is formed in a left-side region 10 that is positioned at the left side of the one second gap region 7, and the other inner-side second through hole 14*a* is formed in a right-side region 11 that is positioned at the right side of the second gap region 7.

A width of the first gap region 6 and that of the second gap region 7 (that is, a length in an orthogonal direction perpendicular to the longitudinal direction of each of the gaps; a length in the right-left direction of the first gap region 6 and a length in the front-rear direction of the second gap region 7) are generally the same, and are, for example, 2000 μm or less, preferably 1500 μm or less, more preferably 1000 μm or less, and for example, 10 μm or more, preferably 30 μm or more.

The surrounding region 3 is around (that is, outer side in the front-rear direction and outer side in the right-left direction of) the mounting board region 2, and is a margin region positioned in a peripheral end portion of the board sheet 1. The surrounding region 3 has a generally frame shape when viewed from the top in which the inner shape and the outer shape thereof are a generally rectangular shape. The inner peripheral edge of the surrounding region 3 is continuous to the outer peripheral edge of the mounting board region 2.

The surrounding region 3 includes the front-side region 8, the rear-side region 9, the left-side region 10, and the right-side region 11. The front-side region 8 is a region that is positioned at the front side of the mounting board region 2, and is formed from the front end edge of the mounting board region 2 to the front end edge of the board sheet 1 in the front-rear direction. The rear-side region 9 is a region that is positioned at the rear side of the mounting board region 2, and is formed from the rear end edge of the mounting board region 2 to the rear end edge of the board sheet 1 in the front-rear direction. The left-side region 10 is a region that is positioned at the left side of the mounting board region 2, and is formed from the left end edge of the mounting board region 2 to the left end edge of the board sheet 1 in the right-left direction. The right-side region 11 is a region that is positioned at the right side of the mounting board region 2, and is formed from the right end edge of the mounting board region 2 to the right end edge of the board sheet 1 in the right-left direction. In four corners (front-left corner portion, front-right corner portion, rear-left corner portion, rear-right corner portion) of the surrounding region 3, each of the regions (for example, the front-side region 8 and the left-side region 10) is overlapped.

In the surrounding region 3, the plurality of through holes 12 are formed. The plurality of through holes 12 pass through the board sheet 1 in the up-down direction, and include a plurality of (eight) first through holes 13 and a plurality of (eight) second through holes 14.

The plurality of first through holes 13 have an elongated shape when viewed from the top, and are formed linearly extending in the front-rear direction (longitudinal direction). The plurality of first through holes 13 are disposed in the front-side region 8 and the rear-side region 9. To be specific, the plurality of (four) first through holes 13 are disposed at spaced intervals to each other in the right-left direction in the front-side region 8. The plurality of (four) first through holes 13 are disposed at spaced intervals to each other in the right-left direction in the rear-side region 9. The first through holes 13 disposed in the front-side region 8 are disposed so as to face the first through holes 13 disposed in the rear-side region 9 with the mounting board region 2 sandwiched therebetween. That is, the four pairs of first through holes 13 facing each other in the front-rear direction are disposed.

The first through holes 13 are formed along phantom lines 15 (15*a* and 15*b*) (that is, linear extending lines 15 formed by end edges 16 of the mounting board 4) extending along the end edges 16 (the left end edge 16*a* and the right end edge 16*b*) of the mounting board 4. That is, the end edges in the right-left direction (end edges in the width direction) of the first through holes 13 coincide with the phantom lines 15.

To be specific, of the plurality of first through holes 13, the two pairs of first through holes 13 (the inner-side first through holes 13*a*) disposed in the middle in the right-left direction are each formed to be along both of the phantom line 15*b* and the phantom line 15*a*. The phantom line 15*b* extends along the right end edge 16*b* of the mounting board 4*a* that is positioned at the left side in the two mounting boards 4 (4*a* and 4*b*) that are next to each other in the right-left direction. The phantom line 15*a* extends along the left end edge 16*a* of the mounting board 4*b* that is positioned at the right side in the two mounting boards 4 (4*a* and 4*b*). That is, in the right-left direction (width direction), the inner-side first through hole 13*a* is formed so as to be continuous from the phantom line 15b extending along the right end edge 16b of the mounting board 4a to the phantom line 15a, extending along the left end edge 16a, of the mounting board 4b.

The two pairs of first through holes 13 (the outer-side first through holes 13b) disposed at the outer side in the right-left direction are each formed so as to be along one of the phantom lines 15 (15a or 15b) extending along the left end edge 16a or the right end edge 16b of the mounting board 4. That is, the one pair of outer-side first through holes 13b positioned at the leftmost side are formed so as to be along the phantom line 15a extending along the left end edge 16a of the mounting board 4 positioned at the leftmost side (that is, the left end edge of the mounting board region 2). The one pair of outer-side first through holes 13b positioned at the rightmost side are formed so as to be along the phantom line 15b extending along the right end edge 16b of the mounting board 4 positioned at the rightmost side (that is, the right end edge of the mounting board region 2).

The width (direction perpendicular to the longitudinal direction) of the first through hole 13 is generally the same as the distance (width of the first gap region 6) between the two mounting boards 4 next to each other in the right-left direction.

As shown in FIG. 2B, in side cross-sectional view, the first through hole 13 is formed so that end edges 17 of the first through hole 13 facing each other in the front-rear direction along the end edges 16 (the left end edge 16a and the right end edge 16b) gradually get closer to each other in the up-down direction (thickness direction). To be specific, a front end edge 17a and a rear end edge 17b of the first through hole 13 have a generally tapered shape when viewed in cross section in which the distance therebetween decreases as it is closer to the upper side. That is, the upper surface of the front end edge 17a of the first through hole 13 is formed to be an acute angle toward the inner side of the first through hole 13, and the upper surface of the rear end edge 17b of the first through hole 13 is formed to be the acute angle toward the inner side of the first through hole 13.

As shown in FIG. 1, the plurality of second through holes 14 have an elongated shape when viewed from the top, and are formed linearly extending in the right-left direction (longitudinal direction). The plurality of second through holes 14 are disposed in the left-side region 10 and the right-side region 11. To be specific, the plurality of (four) second through holes 14 are disposed at spaced intervals to each other in the front-rear direction in the left-side region 10. The plurality of (four) second through holes 14 are disposed at spaced intervals to each other in the front-rear direction in the right-side region 11. The second through holes 14 disposed in the left-side region 10 are disposed so as to face the second through holes 14 disposed in the right-side region 11 with the mounting board region 2 sandwiched therebetween. That is, the four pairs of second through holes 14 facing each other in the right-left direction are disposed.

The second through holes 14 are formed along the phantom lines 15 (15c and 15d) extending along the end edges 16 (the front end edge 16c and the rear end edge 16d) of the mounting board 4. That is, the end edges in the width direction of the second through holes 14 coincide with the phantom lines 15.

To be specific, of the plurality of second through holes 14, the two pairs of second through holes 14 (the inner-side second through holes 14a) disposed in the middle in the front-rear direction are each formed so as to be along both of the phantom line 15d and the phantom line 15c. The phantom line 15d extends along the rear end edge 16d of the mounting board 4a that is positioned at the front side in the two mounting boards 4 (4a and 4c) that are next to each other in the front-rear direction. The phantom line 15c extends along the front end edge 16c of the mounting board 4c that is positioned at the rear side in the two mounting boards 4 (4a and 4c). That is, in the front-rear direction, the inner-side second through hole 14a is formed so as to be continuous from the phantom line 15d extending along the rear end edge 16d of the mounting board 4a to the phantom line 15c extending along the front end edge 16c of the mounting board 4c.

The two pairs of second through holes 14 (the outer-side second through holes 14b) disposed at the outer side in the front-rear direction are each formed so as to be along one of the phantom lines 15 (15c or 15d) extending along the front end edge 16c or the rear end edge 16d of the mounting board 4. That is, the one pair of outer-side second through holes 14b positioned at the frontmost side are formed so as to be along the phantom line 15c extending along the front end edge 16c of the mounting board 4 positioned at the frontmost side (that is, the front end edge of the mounting board region 2). The one pair of outer-side second through holes 14b positioned at the rearmost side are formed so as to be along the phantom line 15d extending along the rear end edge 16d of the mounting board 4 positioned at the rearmost side (that is, the rear end edge of the mounting board region 2).

The width of the second through hole 14 is generally the same as the distance in the front-rear direction (width of the second gap region 7) between the two mounting boards 4 next to each other in the front-rear direction.

As shown in FIG. 2A, in side cross-sectional view, the second through hole 14 is formed so that end edges 18 of the second through hole 14 facing each other in the right-left direction along the end edges 16 (the front end edge 16c and the rear end edge 16d) gradually get closer to each other in the up-down direction. To be specific, a left end edge 18a and a right end edge 18b of the second through hole 14 have a generally tapered shape when viewed in cross section in which the distance therebetween decreases as it is closer to the upper side. That is, the upper surface of the left end edge 18a of the second through hole 14 is formed to be the acute angle toward the inner side of the second through hole 14, and the upper surface of the right end edge 18b of the second through hole 14 is formed to be the acute angle toward the inner side of the second through hole 14.

The through hole 12 has a length L in the longitudinal direction (the length in the front-rear direction of the first through hole 13, the length in the right-left direction of the second through hole 14) of, for example, 1 mm or more, preferably 2 mm or more, and for example, 120 mm or less, preferably 80 mm or less.

A width W (the length in an orthogonal direction perpendicular to the longitudinal direction; the length in the right-left direction of the first through hole 13 and the length in the front-rear direction of the second through hole 14) of the through hole 12 is generally the same as the width of the first gap region 6 or the second gap region 7, that is, generally the same as the distance between the two mounting boards 4 next to each other. To be specific, the through hole 12 has a width W of, for example, 2000 μm or less, preferably 1500 μm or less, more preferably 1000 μm or less, and for example, 10 μm or more, preferably 30 μm or more.

An aspect ratio (L/W) of the length L to the width W in the through hole 12 is, for example, 1 or more, preferably 2 or more, more preferably 5 or more, and for example, 3000 or less, preferably 500 or less, more preferably 100 or less.

As shown in FIGS. 2A to 2B, the board sheet 1 includes a base insulating layer 20, a conductive pattern 21, and a cover insulating layer 22 in this order in the up-down direction.

The base insulating layer 20 is disposed as the uppermost layer of the board sheet 1. The base insulating layer 20 forms the outer shape of the board sheet 1, and has a generally rectangular shape when viewed from the top extending in the plane direction. The upper surface of the base insulating layer 20 is formed flat. The base insulating layer 20 has a plurality of electronic component-connecting terminal opening portions 23 and a plurality of external component-connecting terminal opening portions 24 in each of the mounting boards 4 in the mounting board region 2. The base insulating layer 20 has a plurality of first surrounding opening portions 25 in the surrounding region 3.

The plurality of electronic component-connecting terminal opening portions 23 are opening portions for allowing the electronic component-connecting terminals 26 to expose to the upper surface side. The plurality of electronic component-connecting terminal opening portions 23 are disposed in alignment at spaced intervals to each other so as to have a rectangular frame shape in generally the central portion of the mounting board 4. That is, the plurality of electronic component-connecting terminal opening portions 23 are provided so as to correspond to a plurality of terminals 35 (described later) of an electronic component to be mounted. Each of the electronic component-connecting terminal opening portions 23 has a generally circular shape when viewed from the top passing through the base insulating layer 20 in the up-down direction.

The plurality of external component-connecting terminal opening portions 24 are opening portions for allowing the external component-connecting terminals 27 to expose to the upper surface side. The plurality of external component-connecting terminal opening portions 24 are disposed in alignment at spaced intervals to each other in the width direction in the front end portion of the mounting hoard 4. That is, the plurality of external component-connecting terminal opening portions 24 are provided so as to correspond to a plurality of terminals of an external component that are electrically connected thereto. Each of the external component-connecting terminal opening portions 24 has a generally rectangular shape (rectangle-shaped) when viewed from the top passing through the base insulating layer 20 in the up-down direction.

The plurality of first surrounding opening portions 25 are opening portions for forming the through holes 12 by communicating with second surrounding opening portions 29 of the cover insulating layer 22 to be described later. The first surrounding opening portions 25 are formed in the surrounding region 3 so as to correspond to the through holes 12. The first surrounding opening portion 25 has a generally tapered shape when viewed in cross section in which the width thereof decreases as it is closer to the upper side.

The base insulating layer 20 is formed from an insulating material. Examples of the insulating material include synthetic resins such as polyimide resin, polyimide imide resin, acrylic resin, polyether nitrile resin, polyether sulfone resin, polyethylene terephthalate resin, polyethylene naphthalate resin, and polyvinyl chloride resin. Preferably, the base insulating layer 20 is formed from a polyimide resin.

The base insulating layer 20 has a thickness of, for example, 1 µm or more, preferably 5 µm or more, and for example, 30 µm or less, preferably 10 µm or less, more preferably 8 µm or less.

The conductive pattern 21 is provided at the lower side of the base insulating layer 20 so as to be in contact with the lower surface of the base insulating layer 20. The conductive pattern 21 includes the plurality of electronic component-connecting terminals 26, the plurality of external component-connecting terminals 27, and the plurality of wires 28 in each of the mounting boards 4 in the mounting board region 2.

The plurality of electronic component-connecting terminals 26 are terminals for being electrically connected to the electronic component such as imaging element 31 (described later). The plurality of electronic component-connecting terminals 26 are disposed in alignment at spaced intervals to each other so as to have a generally rectangular frame shape in the central portion of the mounting hoard 4. That is, the electronic component-connecting terminals 26 are disposed at the inside of the electronic component-connecting terminal opening portions 23. Each of the electronic component-connecting terminals 26 has a generally circular shape when viewed from the top, and the upper surface thereof is exposed from the upper surface of the base insulating layer 20.

The plurality of external component-connecting terminals 27 are terminals for being electrically connected to the external component (not shown) such as mother board and power source. The plurality of external component-connecting terminals 27 are disposed in alignment at spaced intervals to each other in the width direction in the front end portion of the mounting board 4. That is, the plurality of external component-connecting terminals 27 are disposed at the inside of the external component-connecting terminal opening portions 24. Each of the external component-connecting terminals 27 has a generally rectangular shape (rectangle-shaped) when viewed from the top, and the upper surface thereof is exposed from the upper surface of the base insulating layer 20.

The plurality of wires 28 are provided so as to correspond to the plurality of electronic component-connecting terminals 26 and the plurality of external component-connecting terminals 27. To be specific, the wires 28 are integrally formed with the plurality of electronic component-connecting terminals 26 and the plurality of external component-connecting terminals 27 so as to connect them. That is, one end of the wire 28 is continuous to the electronic component-connecting terminal 26, and the other end thereof is continuous to the external component-connecting terminal 27, so that the electronic component-connecting terminal 26 is electrically connected to the external component-connecting terminal 27.

Examples of a material for the conductive pattern 21 include metal materials such as copper, silver, gold, and nickel, and an alloy thereof, and solder. Preferably, copper is used.

In view of suppression of warping and handleability, the conductive pattern 21 (the wire 28) has a thickness (total thickness) of, for example, 1 µm or more, preferably 3 µm or more, and for example, 15 µm or less, preferably 10 µm or less, more preferably 8 µm or less.

The wire 28 has a width of, for example, 5 µm or more, preferably 10 µm or more, and for example, 200 µm or less, preferably 100 µm or less, more preferably 50 µm or less.

The cover insulating layer is provided at the lower side of the base insulating layer 20 and the conductive pattern 21 so as to cover the conductive pattern 21. That is, the cover insulating layer 22 is disposed so as to be in contact with the lower surface and the side surfaces of the conductive pattern 21 and a portion that is not covered with the conductive pattern 21 on the lower surface of the base insulating layer 20. An outer shape of the cover insulating layer 22 is formed so as to be generally the same as that of the base insulating layer 20. The cover insulating layer 22 has the plurality of second surrounding opening portions 29 in the surrounding region 3.

The plurality of second surrounding opening portions 29 are opening portions for forming the through holes 12 by communicating with the first surrounding opening portions 25 in the base insulating layer 20. The second surrounding opening portions 29 are formed in the surrounding region 3 so as to correspond to the through holes 12. The second surrounding opening portion 29 has a generally tapered shape when viewed in cross section in which the width thereof decreases as it is closer to the upper side.

The cover insulating layer 22 is formed from the same insulating material as that for the base insulating layer 20 described above. Preferably, the cover insulating layer 22 is formed from a polyimide resin.

The cover insulating layer 22 has a thickness of, for example, 1 μm or more, preferably 2 μm or more, and for example, 30 μm or less, preferably 10 μm or less, more preferably 5 μm or less.

In the board sheet 1, the surface at the side in which the electronic component-connecting terminals 26 are exposed, that is, the surface of the base insulating layer 20 is a mounting surface on which the electronic component is mounted. The surface at the opposite side to the mounting surface, that is, the surface of the cover insulating layer 22 is a rear surface on which a temporary fixing sheet 41 (described later) is disposed.

In view of reduction in thickness, a total thickness (maximum thickness) of the board sheet 1, that is, a total thickness of the mounting board 4 is, for example, 60 μm or less, preferably 40 μm or less, more preferably 20 μm or less, further more preferably 10 μm or less, and for example, 1 μm or more, preferably 5 μm or more.

2. Producing Method of Board Assembly Sheet

Next, a method for producing the board sheet 1 is described with reference to FIGS. 3A to 3E. The board sheet 1 can be, for example, produced by a metal supporting plate preparing step, a base insulating layer forming step, a conductive pattern forming step, a cover insulating layer forming step, and a metal supporting plate removing step.

Figure 3A:
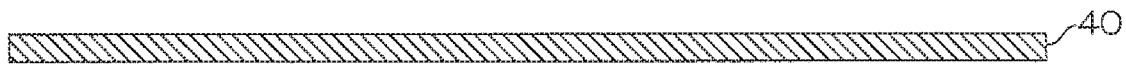
FIGS. 3A to 3F show production process views and a cutting process view of the board assembly sheet shown in FIG. 1.

As shown in FIG. 3A, in the metal supporting plate preparing step, a metal supporting plate 40 is prepared.

The metal supporting plate 40 is, for example, formed from metal materials such as stainless steel, 42-alloy, aluminum, and copper alloy. Preferably, the metal supporting plate 40 is formed from stainless steel.

The metal supporting plate 40 has a thickness of, for example, 5 μm or more, preferably 10 μm or more, and for example, 50 μm or less, preferably 30 μm or less.

The upper surface of the metal supporting plate 40 is formed flat (smooth).

Figure 3B:
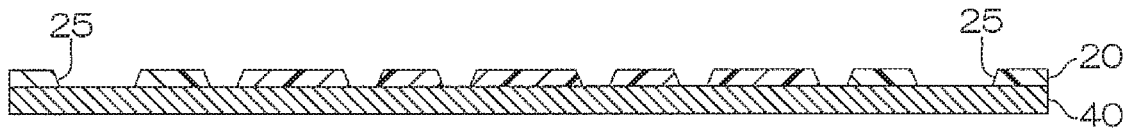

As shown in FIG. 3B, in the base insulating layer forming step, the base insulating layer 20 is formed on the upper surface of the metal supporting plate 40. To be specific, the base insulating layer 20 having the opening portions (the electronic component-connecting terminal opening portion 23, the external component-connecting terminal opening portion 24, and the first surrounding opening portion is formed on the upper surface of the metal supporting plate 40.

To be specific, as a material for the base insulating layer 20, a varnish of a photosensitive insulating material (for example, photosensitive polyimide) is applied to the entire upper surface of the metal supporting plate 40 to be dried, thereby forming a base film (base insulating layer). Thereafter, the base film is exposed to light via a photomask having a pattern corresponding to the opening portions (23, 24, and 25). Thereafter, the base film is developed, and cured by heating as needed.

Figure 3C:
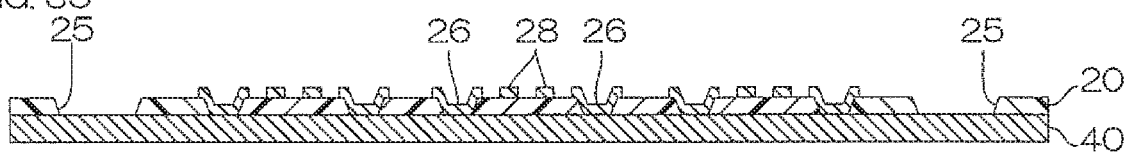

As shown in FIG. 3C, in the conductive pattern forming step, the conductive pattern 21 is formed on the upper surface of the base insulating layer 20. To be specific, the conductive pattern 21 is formed on the upper surface of the base insulating layer 20 and on portions in the upper surface of the metal supporting plate 40 that are exposed at the electronic component-connecting terminal opening portions 23 and the external component-connecting terminal opening portions 24.

Examples of a forming method of the conductive pattern 21 include additive method and subtractive method.

Figure 3D:
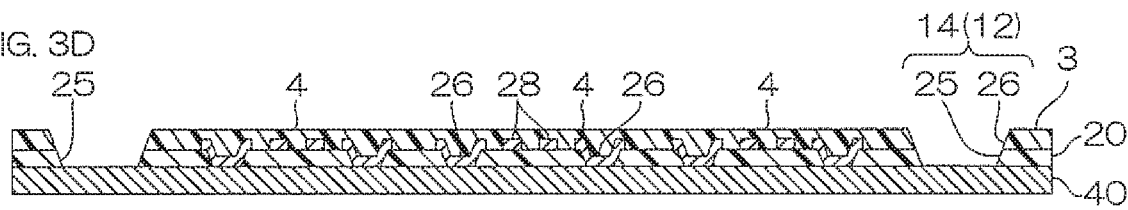

As shown in FIG. 3D, in the cover insulating layer forming step, the cover insulating layer 22 is formed on the upper surfaces of the conductive pattern 21 and the base insulating layer 20. To be specific, the cover insulating layer 22 is formed on the upper surface and the side surfaces of the conductive pattern 21, and a portion that is not covered with the conductive pattern 21 on the upper surface of the base insulating layer 20.

The cover insulating layer 22 is formed so as to have the second surrounding opening portions 29 positioned corresponding to the first surrounding opening portions 25 in the base insulating layer 20. In this manner, the through holes 12 passing through the board sheet 1 in the up-down direction are formed.

The forming method of cover insulating layer 22 is, for example, the same as that of the base insulating layer 20.

In this manner, the board sheet 1 including the base insulating layer 20, the conductive pattern 21, and the cover insulating layer 22 is obtained in a state of being supported by the metal supporting plate 40.

Figure 3E:
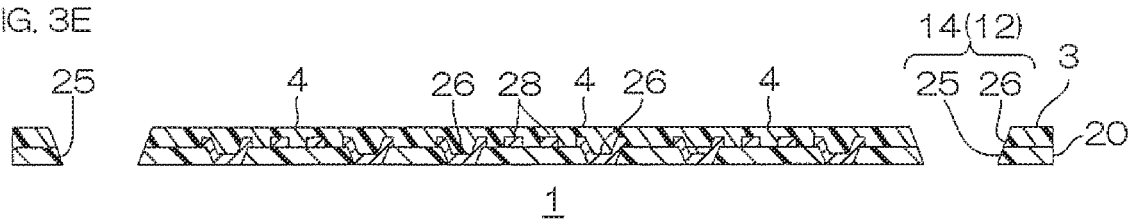

As shown in FIG. 3E, in the metal supporting plate removing step, the metal supporting plate 40 is removed.

Examples of a removing method include a method of peeling the metal supporting plate 40 from the lower surface of the board sheet 1 and a method of processing the metal supporting plate 40 by wet etching.

In this manner, the board sheet 1 including the base insulating layer 20, the conductive pattern 21, and the cover insulating layer 22 is obtained. The produced board sheet 1 is reversed upside down, thereby obtaining the board sheet 1 shown in FIG. 1.

3. Singulation of Board Assembly Sheet

Figure 3F:
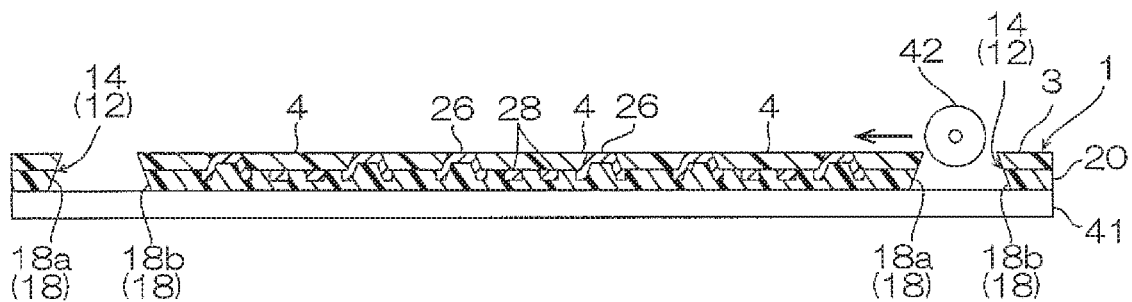

Next, a method for singulating the mounting boards 4 of the board sheet 1 is described with reference to FIGS. 3F and 4. The board sheets 1 can be, for example, singulated by a temporary fixing sheet disposing step and a cutting step.

In the temporary fixing sheet disposing step, the board sheet 1 is disposed in the temporary fixing sheet 41.

To be specific, the board sheet 1 is disposed on the upper surface of the temporary fixing sheet 41 so that the upper surface of the temporary fixing sheet 41 is brought into contact with the entire rear surface (opposite side to the mounting surface: the cover insulating layer 22) of the board sheet 1.

The temporary fixing sheet 41 is a sheet that fixes the board sheet 1 so as to surely cut the board sheet 1 and can be peeled off from the singulated mounting boards 4 after the cutting step. Examples of the temporary fixing sheet 41 include dicing tapes such as slightly adhesive-type dicing tape and ultraviolet ray peeling-type dicing tape.

In the cutting step, the board sheet 1 is cut to be formed into the plurality of mounting boards 4. That is, the board sheet 1 is diced along each of the outer shapes (the end edges 16a to 16d) of the plurality of mounting boards 4 by using a cutting blade of a cutting device.

As the cutting blade, for example, a dicing blade 42 having a disk shape and rotatable with respect to its axis is used. The width of the dicing blade 42 is generally the same as that of the through hole 12.

In the cutting method, first, the blade edge of the dicing blade 42 is disposed so as to be along the longitudinal direction of the through hole 12 and to be inserted into the through hole 12, and next, the dicing blade 42 is relatively moved toward the inner side of the board sheet 1 (that is, along the gap region 5) to another through hole 12 facing thereto with the mounting board region 2 sandwiched therebetween.

To be specific, in the cutting in the front-rear direction, the blade edge of the dicing blade 42 is inserted into the first through hole 13 in the front-side region 8, and next, the dicing blade 42 is relatively moved in the front-rear direction with respect to the board sheet 1 from the first through hole 13 in the front-side region 8 to the first through hole 13 in the rear-side region 9 along the first gap region 6 on the phantom line 15. Meanwhile, in the cutting in the right-left direction, the blade edge of the dicing blade 42 is inserted into the second through hole 14 in the left-side region 10, and next, the dicing blade 42 is relatively moved in the right-left direction with respect to the board sheet 1 from the second through hole 14 in the left-side region 10 to the second through hole 14 in the right-side region 11 along the second gap region 7 on the phantom line 15.

At this time, immediately after the moving, the dicing blade 42 gradually starts shaving the upper end of the end edge of the through hole 12 (front end of the acute angle formed in the front end edge 17a of the first through hole 13, front end of the acute angle formed in the left end edge 18a of the second through hole 14) in the board sheet 1, and thereafter, completely shaves the board sheet 1 in the up-down direction.

As shown in FIG. 4, in this manner, a cutting through hole 45 obtained by cutting in the cutting step is formed in a lattice shape in the board sheet 1, and the plurality of mounting boards 4 are independent from each other.

Thereafter, the cut board sheet 1 is peeled from the temporary fixing sheet 41.

In this manner, the singulated plurality of mounting boards 4 are obtained. The mounting board 4 is a wiring circuit board for mounting the electronic component (described later) such as the imaging element 31, and does not include the electronic component yet.

The mounting board 4 is, for example, preferably used for the wiring circuit board for mounting the imaging element 31 (described later). That is, the mounting board 4 is preferably used for an imaging device such as camera module.

4. Mounted Device

Figure 5:
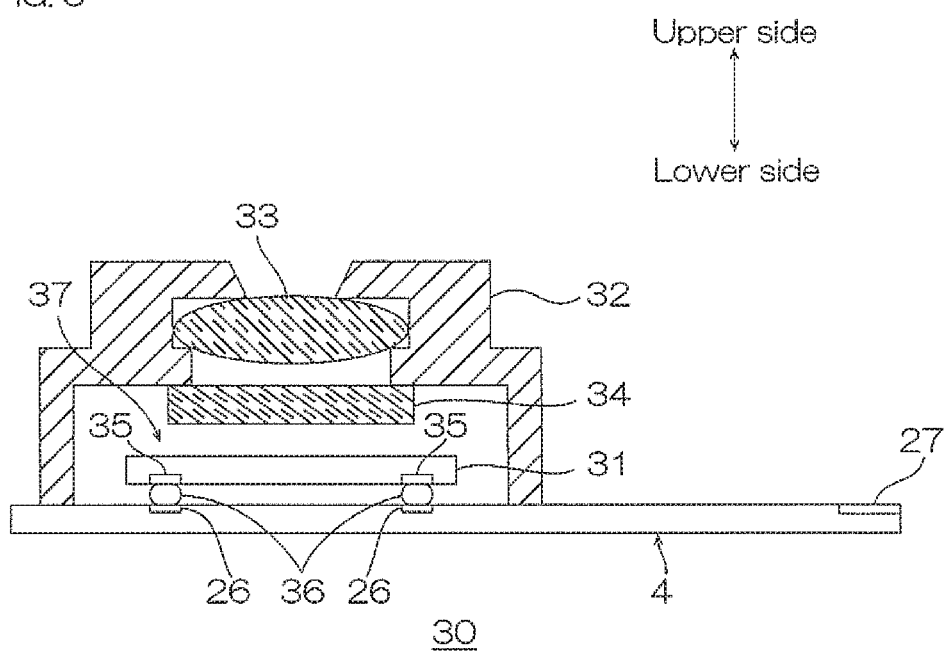
FIG. 5 shows an imaging device including a mounting board obtained from the board assembly sheet shown in FIG. 1.

As one example of a mounted device including the mounting board 4, an imaging device 30 is described with reference to FIG. 5. The imaging device 30 includes the mounting hoard 4, the imaging element 31 as one example of an electronic component, a housing 32, an optical lens 33, and a filter 34.

The mounting board 4 is disposed so that the base insulating layer 20 that is the mounting surface is defined as the upper side and the cover insulating layer 22 is defined as the lower side.

The imaging element 31 is a semiconductor element that converts light to electric signals, and examples thereof include solid imaging elements such as CMOS sensor and CCD sensor.

The imaging element 31 has a generally rectangular flat plate shape when viewed from the top, and though not shown, includes a silicon such as Si board, and a photo diode (photoelectric converting element) and a color filter that are disposed thereon. The plurality of terminals 35 corresponding to the electronic component-connecting terminals 26 of the mounting board 4 are provided on the lower surface of the imaging element 31.

The imaging element 31 is mounted on the mounting board 4. That is, the terminal 35 of the imaging element 31 is flip-chip mounted on the corresponding electronic component-connecting terminal (imaging element-connecting terminal) 26 of the mounting board 4 via a solder bump 36 or the like. In this manner, the imaging element 31 is disposed in the central portion of the mounting board 4 to be electrically connected to the electronic component-connecting terminal 26 of the mounting board 4.

The imaging element 31 is mounted on the mounting board 4 to constitute an imaging unit 37. That is, the imaging unit 37 includes the mounting board 4 and the imaging element 31 that is mounted thereon.

The housing 32 is disposed in the central portion when viewed from the top of the mounting board 4 so at to be spaced apart from and to surround the imaging element 31 so as to surround it. The housing 32 has a generally rectangular cylindrical shape when viewed from the top. In the upper end of the housing 32, a fixing portion for fixing the optical lens 33 is provided.

The optical lens 33 is disposed at the upper side of the mounting board 4 at spaced intervals to the mounting board 4 and the imaging element 31. The optical lens 33 has a generally circular shape when viewed from the top, and is fixed by the fixing portion so that light from the outside reaches the imaging element 31.

The filter 34 is disposed between the imaging element 31 and the optical lens 33 at spaced intervals thereto, and fixed to the housing 32.

5. Function and Effect

The board sheet 1 is a board assembly sheet in which the plurality of mounting hoards 4 are defined. The mounting hoard 4 has a total thickness of 60 μm or less. The board sheet 1 has the through hole 13 and the second through hole 14 passing through the board sheet 1 in the up-down direction. The first through hole 13 and the second through hole 14 are formed so as to be along the phantom line 15 (linear extending line formed by each of the end edges 16a to 16d) extending along the end edges 16a to 16d of the mounting board 4.

According to the board sheet 1, the dicing blade 42 is inserted into each of the first through holes 13 and the second through holes 14 at the time of singulation, and next, the board sheet 1 can be cut from the side surface thereof along the gap region 5 on the end edge 16 or on the phantom line 15 in the mounting board 4. Thus, when the dicing blade 42 is brought into contact with the board sheet 1, pressing of the dicing blade 42 toward the board sheet 1 in the up-down direction can be prevented. Accordingly, an impact or a distortion imparted to the entire board sheet 1 can be reduced. Therefore, damage of the board sheet 1 and the damage of the mounting board 4 can be reduced, and a yield of the mounting board 4 can be improved. That is, the plurality of mounting boards 4 can be efficiently obtained.

Also, the first through hole 13 and the second through hole 14 are formed in advance, so that cutting dusts in the volume of the first through hole 13 and the second through hole 14 can be reduced, and contamination of the mounting board 4 can be suppressed.

In the board sheet 1, the mounting board 4 has a generally rectangular shape extending in the front-rear direction and the right-left direction when viewed from the top, and includes the first through hole 13 extending in the front-rear direction and the second through hole 14 extending in the right-left direction.

According to the board sheet 1, the impact or the distortion imparted to the entire board sheet 1 can be reduced in both of the cuttings in the front-rear direction and the right-left direction. Thus, the mounting board 4 in a generally rectangular shape when viewed from the top can be more surely obtained without damage.

In the board sheet 1, the first through hole 13 and the second through hole 14 have a width of 2000 μm or less.

According to the board sheet 1, when the board sheet 1 is cut by using the dicing blade 42 having the same width as the width of the first through hole 13 and the second through hole 14, the cutting area can be reduced. Thus, the cutting dusts can be reduced, and the contamination of the mounting board 4 can be suppressed.

In the board sheet 1, the width of the first through hole 13 and the second through hole 14 is generally the same as the width of the first gap region 6 and the second gap region 7.

According to the board sheet 1, the right end edge 16*b* of the mounting board 4 at the left side and the left end edge 16*a* of the mounting board 4 at the right side can be simultaneously cut by one cutting. Or, the rear end edge 16*d* of the mounting board 4 at the front side and the front end edge 16*c* of the mounting board 4 at the rear side can be simultaneously cut. Thus, there is no need for cutting in each of the end edges, so that the number of cutting steps can be reduced.

In the board sheet 1, the end edges 17 of the first through hole 13 facing each other in the front-rear direction gradually get closer to each other as they go closer to the upper side (the side of the mounting surface). The end edges 18 of the second through hole 14 facing each other in the right-left direction gradually get closer to each other as they go closer to the upper side (the side of the mounting surface). Thus, the dicing blade 42 can be gradually brought into contact with the acute angle of the upper ends of both end edges 17 and 18 of the first through hole 13 and the second through hole 14 to be cut. Thus, the impact imparted to the entire board sheet 1 can be furthermore reduced, and the damage of the board sheet 1 can be furthermore suppressed.

Figure 6:
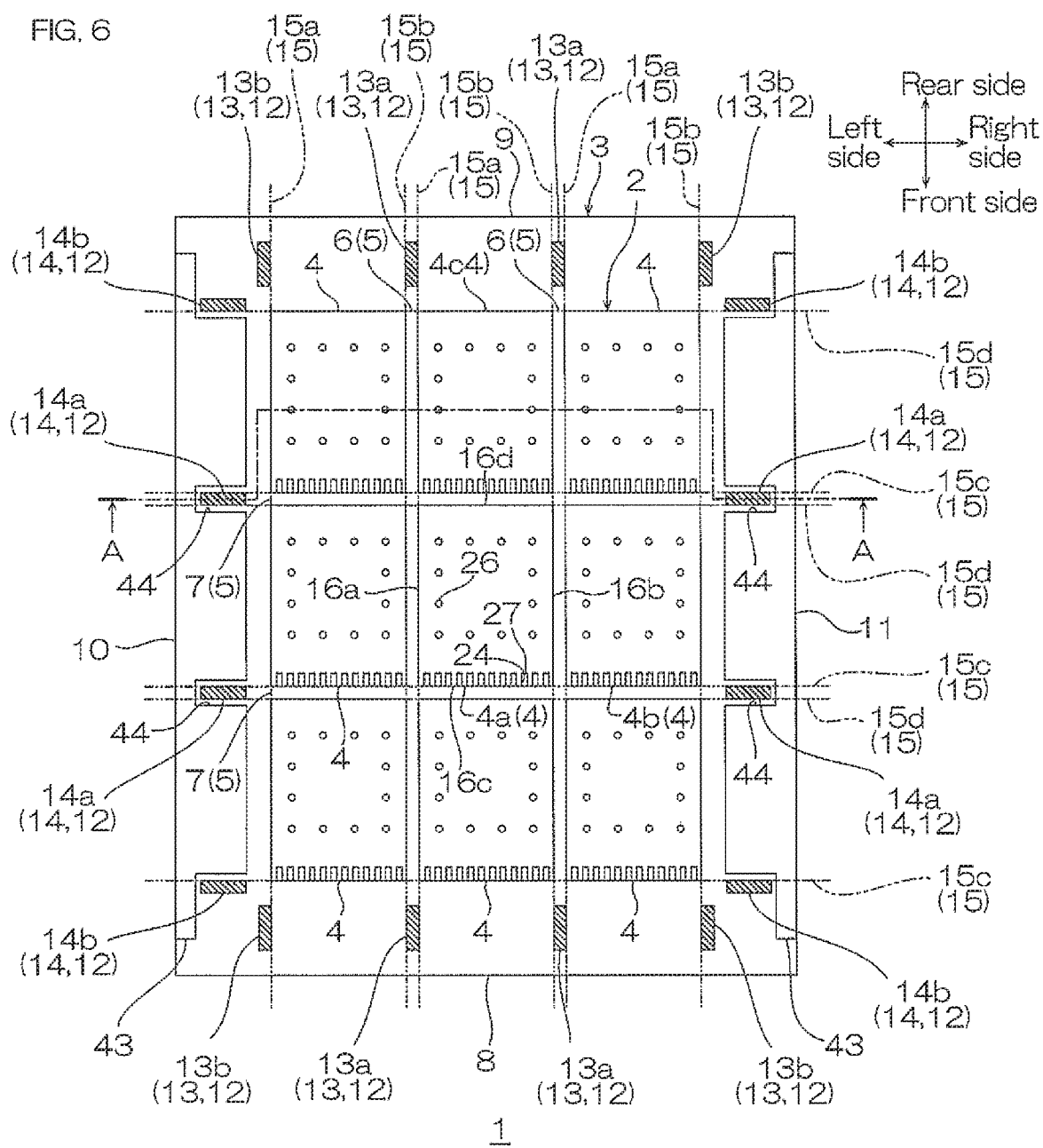
FIG. 6 shows a plan view of a modified example (embodiment including a reinforcement layer) of the board assembly sheet shown in FIG. 1.

6. Modified Examples (1) In the embodiment shown in FIG. 1, the board sheet 1 includes the base insulating layer 20, the conductive pattern 21, and the cover insulating layer 22. As shown in FIG. 6, the board sheet 1 may further include a reinforcement layer 43.

Figure 7:
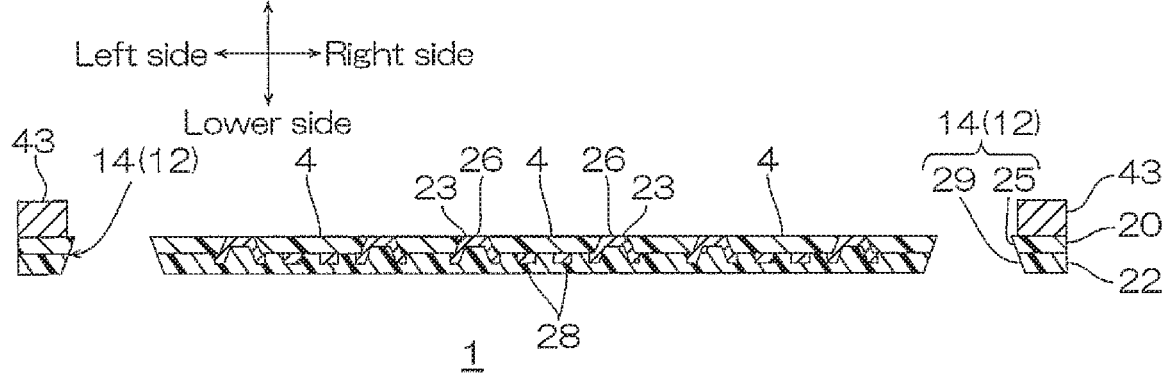
FIG. 7 shows an A-A cross-sectional view of the board assembly sheet shown in FIG. 6.

That is, as referred to FIG. 7, the board sheet 1 shown in FIG. 6 includes the reinforcement layer 43, the base insulating layer 20, the conductive pattern 21, and the cover insulating layer The reinforcement layer 43 is disposed on the upper surface of the base insulating layer 20. The reinforcement layer 43 is disposed in the surrounding region 3 when viewed from the top. To be specific, the reinforcement layer 43 is disposed in each of the left-side region 10 and the right-side region 11. The reinforcement layer 43 has a generally rectangular shape when viewed from the top. The reinforcement layer 43 is formed so as not to be overlapped with the through holes 12 (the first through holes 13) when projected in the up-down direction. That is, a cut-out portion 44 that protrudes outwardly from the inner-end edge in the right-left direction is formed in the reinforcement layer 43.

In the embodiment shown in FIG. 6, a sag of the mounting board region 2 can be suppressed, and handling properties of the board sheet 1 are improved. As a result, the mounting boards 4 can be more accurately singulated, and the yield of the mounting board 4 can be improved.

(2) In the embodiment shown in FIG. 1, the board sheet 1 includes the one mounting board region 2. Alternatively, for example, though not shown, the board sheet 1 may include a plurality of (two or more) mounting board regions 2. That is, the plurality of mounting board regions 2 may be also disposed in alignment in the front-rear direction or the right-left direction at wider spaced intervals (the surrounding region 3) than the gap region 5 that is formed in the mounting board region 2.

Figure 8:
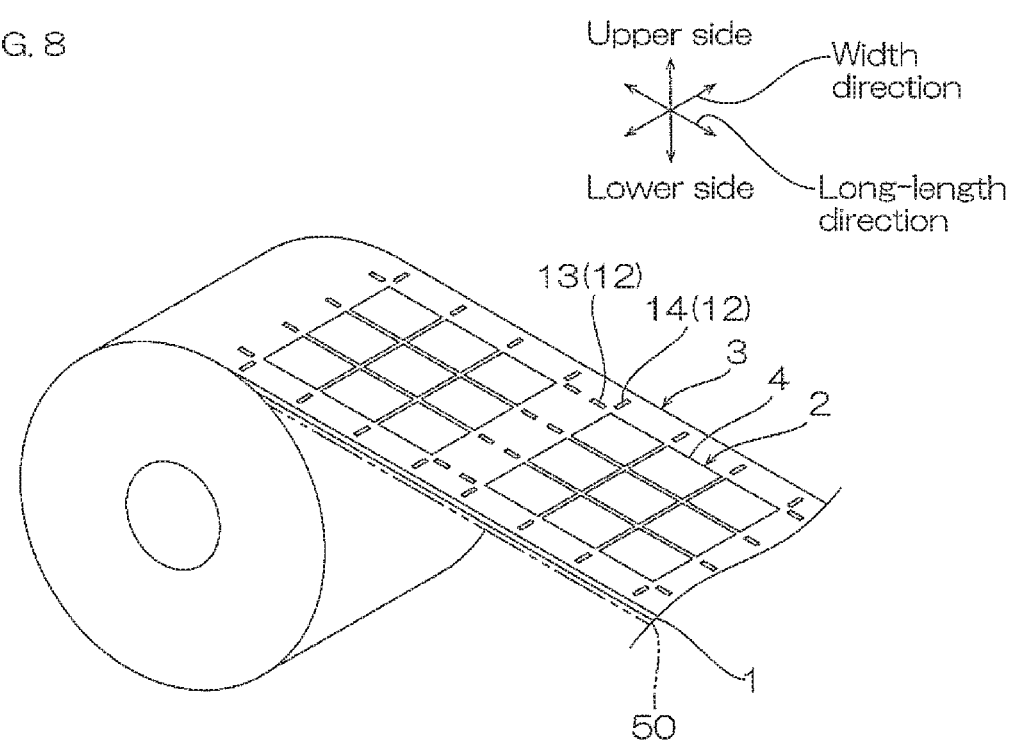
FIG. 8 shows a plan view of a modified example (embodiment in which the board assembly sheet is a long-length sheet) of the board assembly sheet shown in FIG. 1.

(3) In the embodiment shown in FIG. 1, the board sheet 1 has a sheet shape (paper sheet) extending in the plane direction. Alternatively, for example, as shown in FIG. 8, the board sheet 1 may be also a long-length sheet extending long in the front-rear direction. The board sheet 1 shown in FIG. 8 is wound around into a roll shape.

In the board sheet 1 shown in FIG. 8, a plurality of regions including the mounting board region 2 and the surrounding region 3 corresponding thereto are continuous in a long-length direction.

In the embodiment shown in FIG. 8, the board sheet 1 extends long in the front-rear direction. Alternatively, for example, though not shown, the board sheet 1 may also extend long in the right-left direction.

(4) In the embodiment shown in FIG. 1, as referred to FIG. 2, each of the end edges 17 of the first through hole 13 and the end edges 18 of the second through hole 14 gradually gets closer to each other as each of them goes closer to the upper side. That is, the through hole 12 has a generally tapered shape when viewed in cross section. Alternatively, for example, though not shown, each of the end edges 17 of the first through hole 13 and the end edges 18 of the second through hole 14 may also retain a certain distance in the up-down direction. That is, each of the first through hole 13 and the second through hole 14 may also have a generally rectangular shape when viewed in cross section.

In the producing method of this embodiment, for example, the first through hole 13 and the second through hole 14 can be also formed by laser processing or the like.

(5) In the embodiment shown in FIG. 1, the through hole 12 are each formed so as to be along the phantom line 15 in the surrounding region 3. Alternatively, for example, though not shown, a through hole that is not along the phantom line 15 may be also formed in addition to the through hole 12.

(6) In the embodiment shown in FIGS. 1 and 2A to 2B, the board sheet 1 and the mounting board 4 include the base insulating layer 20, the conductive pattern 21, and the cover insulating layer 22. That is, the conductive layer (conductive pattern) of the board sheet 1 is a single layer. Alternatively, for example, though not shown, the conductive layer of the board sheet 1 may be also a plurality of layers. That is, for example, the board sheet 1 may also include the base insulating layer 20, the conductive pattern 21, the cover insulating layer 22, the second conductive pattern, and the second cover insulating layer in this order in the up-down direction (structure of two layers of conductive layer). Or, the board sheet 1 may also include the base insulating layer 20, the conductive pattern 21, the cover insulating layer 22, the second conductive pattern, the second cover insulating layer, the third conductive pattern, and the third cover insulating layer in this order in the up-down direction (structure of three layers of conductive layer).

The configuration of the second conductive pattern and the third conductive pattern is the same as that of the conductive pattern 21, and the configuration of the second cover insulating layer and the third cover insulating layer is the same as that of the cover insulating layer 22.

The total thickness of the mounting board 4 is the same (for example, 60 μm or less) as that of the embodiment shown in FIG. 1.

The total thickness of the wire (for example, the total thickness of the wire 28 included in the conductive pattern 22, the wire included in the second conductive pattern, and the metal wire included in the third conductive pattern) is, in view of suppression of warping, for example, 15 μm or less, preferably 10 μm or less, more preferably 8 μm or less, and in view of handleability, for example, 1 μm or more, preferably 3 μm or more.

Second Embodiment

Figure 9:
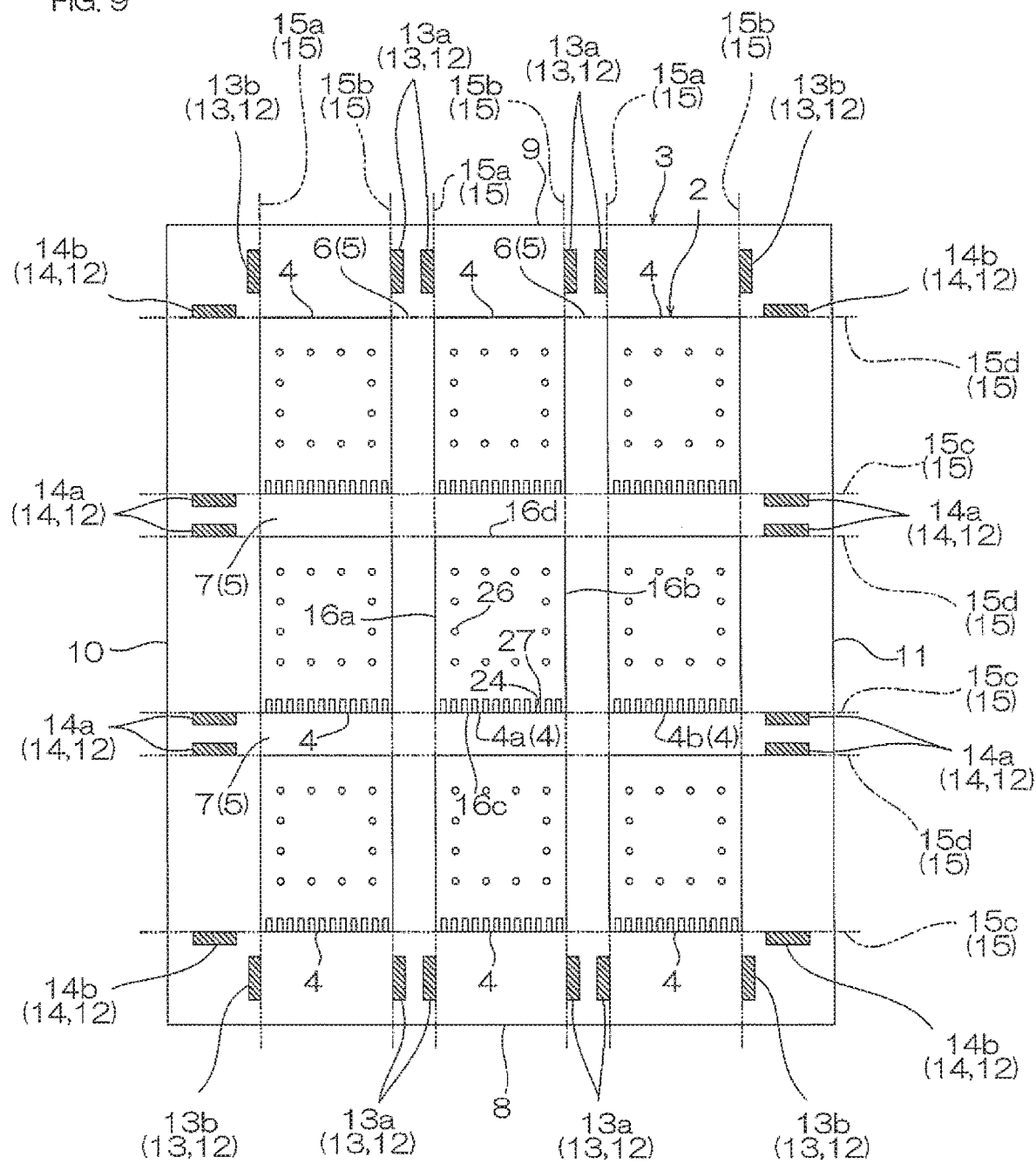
FIG. 9 shows a plan view of a second embodiment of a board assembly sheet of the present invention.

The board sheet 1 of the second embodiment is described with reference to FIG. 9. In the board sheet 1 of the second embodiment, the same reference numerals are provided for members corresponding to each of those in the above-described first embodiment, and their detailed description is omitted.

In the board sheet 1 of the second embodiment, the two pairs of through holes 12 are provided corresponding to each of the gap regions 5.

That is, the two pairs of first through holes 13 are provided in the surrounding region 3 that is positioned at the outer side of each of the first gap regions 6. To be specific, the two inner-side first through holes 13a are formed in the front-side region 8 that is positioned at the front side of the one first gap region 6, and the two inner-side first through holes 13a are formed in the rear-side region 9 that is positioned at the rear side of the first gap region 6.

The inner-side first through hole 13a at the left side is formed so as to be along the phantom line 15b extending along the right end edge 16b of the mounting board 4a that is positioned at the left side. That is, the left end edge of the inner-side first through hole 13a at the left side coincides with the phantom line 15b. Meanwhile, the inner-side first through hole 13a at the right side is formed so as to be along the phantom line 15a extending along the left end edge 16a of the mounting board 4b that is positioned at the right side. That is, the right end edge of the inner-side first through hole 13a at the right side coincides with the phantom line 15a.

The two pairs of second through holes 14 are provided in the surrounding region 3 that is positioned at the outer side of each of the second gap regions 7. To be specific, the two inner-side second through holes 14a are formed in the left-side region 10 that is positioned at the left side of the one second gap region 7, and the two inner-side second through holes 14a are formed in the right-side region 11 that is positioned at the right side of the second gap region 7.

The inner-side second through hole 14a at the front side is formed so as to be along the phantom line 15d extending along the rear end edge 16d of the mounting board 4a that is positioned at the front side. That is, the front end edge of the inner-side second through hole 14a at the front side coincides with the phantom line 15d. Meanwhile, the inner-side second through hole 14a at the rear side is formed so as to be along the phantom line 15c extending along the front end edge 16c of the mounting board 4c that is positioned at the rear side. That is, the rear end edge of the inner-side second through hole 14a at the rear side coincides with the phantom line 15c.

In the board sheet 1, the blade edge of the dicing blade 42 is disposed so as to be along the longitudinal direction of each of the through holes 12 and to be inserted into each of the through holes 12, and next, the dicing blade 42 is relatively moved to another through hole 12 facing thereto with the mounting board region 2 sandwiched therebetween, so that the mounting boards 4 can be singulated.

In the board sheet 1 of the second embodiment, the same function and effect as that of the board sheet 1 of the first embodiment can be achieved. In view of reduction of the number of cutting steps, preferably, the first embodiment is used.

In the modified example of the second embodiment, the same modified example as that of the first embodiment can be applied.

Third Embodiment

Next, the board sheet 1 of a third embodiment is described with reference to FIG. 10. In the board sheet 1 of the third embodiment, the same reference numerals are provided for members corresponding to each of those in the above-described first to second embodiments, and their detailed description is omitted.

In the board sheet 1 of the third embodiment, the plurality of (24) through holes 12 are formed so as to be along a portion of the end edge 16 of the mounting board 4.

To be specific, of the plurality of (12) first through holes 13, the plurality of (six) inner-side first through holes 13a are formed between the mounting boards 4 that are next to each other. That is, the plurality of inner-side first through holes 13a are formed in the first gap region 6 of the mounting board region 2. The width of the inner-side first through hole 13a is generally the same as the distance in the right-left direction (width of the first gap region 6) between the two mounting boards 4 that are next to each other. That is, the inner-side first through hole 13a is continuous from the right end edge 16h of the mounting board 4a that is disposed at the left side to the left end edge 16a of the mounting board 4b that is disposed at the right side.

The plurality of (six) outer-side first through holes 13b are formed so as to be next to the outer-side end edge (the left end edge or the right end edge) of the mounting board region 2 in the surrounding region 3. The outer shape of the outer-side first through hole 13b is the same as that of the inner-side first through hole 13a.

Of the plurality of (12) second through holes 14, the plurality of (six) inner-side second through holes 14a that are disposed at the middle in the front-rear direction are formed between the mounting boards 4 that are next to each other. That is, the plurality of inner-side second through holes 14a are formed in the second gap region 7 of the mounting board region 2. The width of the inner-side second through hole 14a is generally the same as the distance in the front-rear direction (width of the second gap region 7) between the two mounting boards 4 that are next to each other. That is, the inner-side second through hole 14a is continuous from the rear end edge 16d of the mounting board 4a that is disposed at the front side to the front end edge 16c of the mounting board 4c that is disposed at the rear side.

The plurality of (six) outer-side second through holes 14*b* are formed so as to be next to the outer-side end edge (the front end edge or the rear end edge) of the mounting board region 2 in the surrounding region 3. The outer shape of the outer-side second through hole 14*b* is the same as that of the inner-side second through hole 14*a*.

In the third embodiment, the through holes 12 are formed such that each of the end edges 16 (the left end edge 16*a*, the right end edge 16*b*, the front end edge 16*c*, and the rear end edge 16*d*) of each of the mounting boards 4 are in contact with (next to) the through hole 12. That is, the first through holes 13 are formed such that the left end edge 16*a* and the right end edge 16*b* of each of the mounting boards 4 are next to the through hole 13 therealong, and the second through holes 14 are formed such that the front end edge 16*c* and the rear end edge 16*d* of each of the mounting boards 4 are next to the through hole 14 therealong.

In the board sheet 1 of the third embodiment, the same function and effect as that of the board sheet 1 of the first embodiment can be achieved. In view of furthermore suppression of adhesion of the culling dusts to the mounting board 4, preferably, the third embodiment is used. That is, in the board sheet 1 of the third embodiment, the through hole 12 is formed in advance around the mounting board 4, so that the cutting dusts corresponding to the through hole 12 can be reduced around the mounting board 4 (the gap region) at the time of cutting. Therefore, the adhesion of the cutting dusts to the mounting board 4 can be suppressed.

In the modified example of the third embodiment, the same modified example as that of the first embodiment can be applied.

Fourth Embodiment

Figure 11:
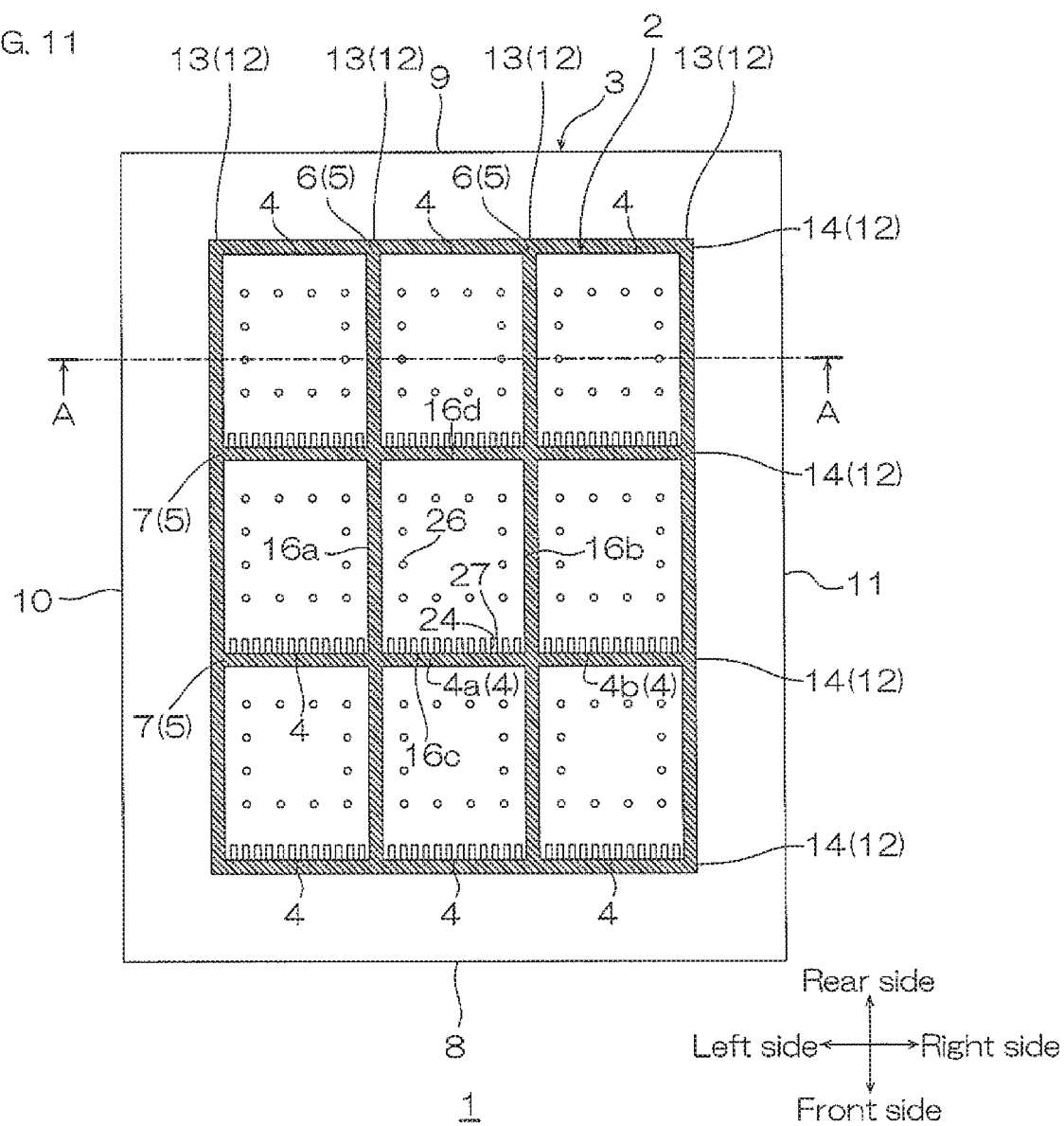
FIG. 11 shows a plan view of a fourth embodiment of a board assembly sheet of the present invention.
Figure 12:
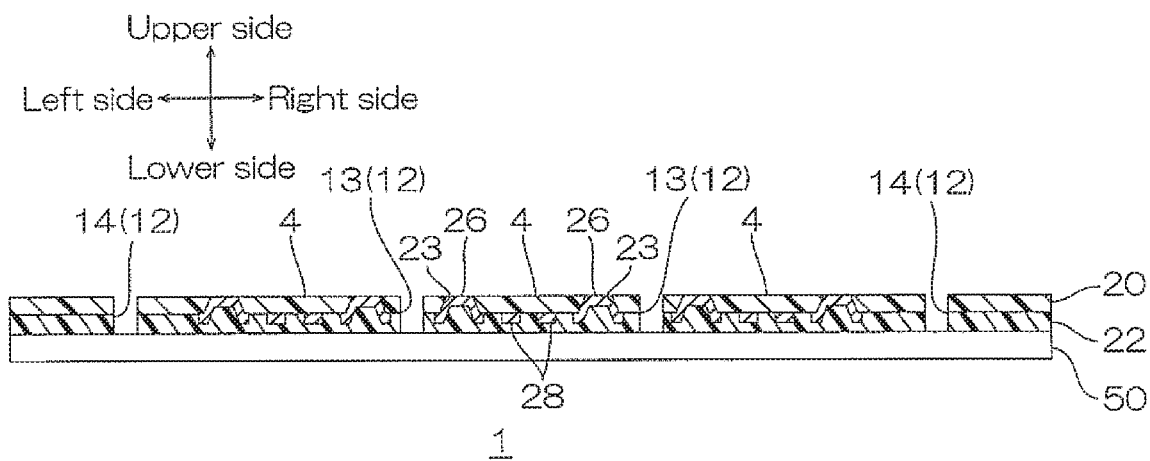
FIG. 12 shows an A-A cross-sectional view of the board assembly sheet shown in FIG. 11.

Next, the board sheet 1 of a fourth embodiment is described with reference to FIGS. 11 and 12. In the board sheet 1 of the fourth embodiment, the same reference numerals are provided for members corresponding to each of those in the above-described first to third embodiments, and their detailed description is omitted.

In the board sheet 1 of the fourth embodiment, the through hole 12 is formed so as to be along the entire end edges 16 of the mounting boards 4.

In the fourth embodiment, the through hole 12 is formed in the entire first gap regions 6 and the entire second gap regions 7, and the surrounding region 3 next to the mounting board region 2.

The through hole 12 has a generally lattice shape when viewed from the top. That is, the through hole 12 includes the plurality of (four) first through holes 13 and the plurality of (four) second through holes 14, and they are perpendicular to each other.

The plurality of first through holes 13 are disposed at spaced intervals to each other in the right-left direction. The first through holes 13 are continuous from the rear end portion of the front-side region 8 to the front end portion of the rear-side region 9.

The plurality of second through holes 14 are disposed at spaced intervals to each other in the front-rear direction. The second through holes 14 are continuous from the right end portion of the left-side region 10 to the left end portion of the right-side region 11.

In the board sheet 1, the plurality of (nine) mounting boards 4 are independent from each other by the through hole 12, and are also independent from the surrounding region 3.

In the board sheet 1 of the fourth embodiment, a supporting layer 50 disposed at the lower side of the board sheet 1 is provided.

The supporting layer 50 supports the plurality of mounting boards 4 and the surrounding region 3. The outer shape of the supporting layer 50 has generally the same shape as that of the board sheet 1.

Examples of the supporting layer 50 include release films made of polyethylene terephthalate (PET) film, polyethylene film, polypropylene film, paper, or the like, and the above-described dicing tapes.

The board sheet 1 of the fourth embodiment can be, for example, produced by the metal supporting plate preparing step, the base insulating layer forming step, the conductive pattern forming step, the cover insulating layer forming step, a supporting layer disposing step, and the metal supporting plate removing step.

The metal supporting plate preparing step, the base insulating layer forming step, the conductive pattern forming step, and the cover insulating layer forming step are the same as those of the first embodiment.

In this manner, the board sheet 1 including the base insulating layer 20, the conductive pattern 21, and the cover insulating layer 22 is obtained in a state of being supported by the metal supporting plate 40.

In the supporting layer disposing step, the supporting layer 50 is disposed on the surface of the cover insulating layer 22 of the board sheet 1.

Lastly, the metal supporting plate removing step is carried out. The metal supporting plate removing step is the same as that of the first embodiment.

In this manner, the board sheet 1 is obtained in a state of being supported by the supporting layer 50.

In the board sheet 1 of the fourth embodiment, the same function and effect as that of the board sheet 1 of the first embodiment can be achieved. In the board sheet 1 of the fourth embodiment, in particular, the through hole 12 is formed so as to be along the entire end edges 16 of the mounting boards 4. Thus, each of the plurality of mounting boards 4 is independent, so that the mounting board 4 can be peeled from the supporting layer 50 without cutting the board sheet 1 at the time of singulation. Accordingly, the damage of the mounting board 4 can be reduced, and the yield of the mounting board 4 can be improved. That is, the plurality of mounting boards 4 can be efficiently obtained.

Also, the through holes 12 are formed in advance, and there is no need for culling, so that the cutting dusts generated by cutting can be surely suppressed, and the contamination of the mounting board 4 can be suppressed.

In the modified example of the fourth embodiment, the same modified example as that of the first embodiment can be applied. The board sheet 1 of the fourth embodiment is wound around into a roll shape in a state of being supported by the supporting layer 50 as shown in FIG. 12. Although not shown, the end edge 17 of the first through hole 13 and the end edge 18 of the second through hole 14 may gradually get closer to each other as they go closer to the upper side as described with reference to FIG. 2.

The first to the fourth embodiments and the modified examples may be used in combination. For example, the through holes shown in FIG. 10 may be provided in addition to the through holes 12 shown in FIG. 1.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICABILITY

The board assembly sheet of the present invention can be applied in various industrial products, and for example, can be preferably used for imaging devices such as camera modules.

DESCRIPTION OF REFERENCE NUMERALS

1 Board assembly sheet
4 Mounting board
12 Through hole
13 First through hole
14 Second through hole
15 Phantom line
16 End edge

The invention claimed is:

1. A board assembly sheet comprising a mounting board region having a plurality of mounting boards each for mounting an electronic component, the mounting boards being defined in the board assembly sheet, and a surrounding region having a generally frame shape when viewed from the top and having an exposed outer peripheral edge, and said surrounding region having an inner peripheral edge that is joined in a continuous and uninterrupted manner to an outer peripheral edge of the mounting board region such that there are no through holes disposed along the outer peripheral edge of the mounting board region, wherein
   each of the mounting boards has a total thickness of 60 µm or less,
   the board assembly sheet has at least one through hole passing through the board assembly sheet in a thickness direction, and
   the at least one through hole is formed at least in the surrounding region to be along a phantom line extending along an end edge of at least one of the mounting boards.

2. The board assembly sheet according to claim 1, wherein
   each of the mounting boards has a generally rectangular shape when viewed from the top extending in a first direction and a second direction perpendicular to the first direction, and
   the at least one through hole includes a first through hole extending in the first direction and a second through hole extending in the second direction.

3. The board assembly sheet according to claim 1, wherein
   a length of the at least one through hole in an orthogonal direction perpendicular to a direction along the end edge is 2000 µm or less.

4. The board assembly sheet according to claim 3, wherein
   the length of the at least one through hole in the orthogonal direction is generally the same as a distance between two mounting boards disposed next to each other in the orthogonal direction.

5. The board assembly sheet according to claim 1, wherein
   the at least one through hole has end edges facing each other in a direction along the end edge and which gradually get closer to each other in the thickness direction.

6. The board assembly sheet according to claim 1, wherein
   the at least one through hole includes a further through hole that is formed between two mounting boards disposed next to each other.

* * * * *